(12) United States Patent
Villafana et al.

(10) Patent No.: US 8,451,009 B2
(45) Date of Patent: May 28, 2013

(54) TECHNIQUES EMPLOYING LIGHT-EMITTING CIRCUITS

(75) Inventors: Martin L. Villafana, San Diego, CA (US); Michael DiBattista, San Diego, CA (US); Gary Woods, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 299 days.

(21) Appl. No.: 12/909,127

(22) Filed: Oct. 21, 2010

(65) Prior Publication Data
US 2011/0101991 A1    May 5, 2011

Related U.S. Application Data

(60) Provisional application No. 61/257,761, filed on Nov. 3, 2009.

(51) Int. Cl.
*G01R 31/02* (2006.01)
(52) U.S. Cl.
USPC .......................................... 324/537
(58) Field of Classification Search
None
See application file for complete search history.

(56) References Cited

U.S. PATENT DOCUMENTS

| | | |
|---|---|---|
| 6,737,880 B2 | 5/2004 | Samaan et al. |
| 7,243,039 B1 | 7/2007 | Suri et al. |
| 7,355,419 B2 | 4/2008 | McDowell et al. |
| 2003/0213952 A1 | 11/2003 | Iechi et al. |
| 2006/0145144 A1 | 7/2006 | Lee et al. |
| 2009/0135166 A1 | 5/2009 | Uchino et al. |

FOREIGN PATENT DOCUMENTS

JP    2004128414 A    4/2004

OTHER PUBLICATIONS

Chua L.L., et al., "General observation of n-type field-effect behavior in organic semiconductors", Nature, Nature Publishing Group, London, GB, vol. 434, No. 7030, Mar. 10, 2005, pp. 194-199, XP002327479, ISSN: 0028-0836, DOI: DOI:10.1038/NATURE03376 figures 1b, 1e, 1d, 2a.

Hepp A., et al.,"Light-Emitting Field Effect Transistor Based on a Tetracene Thin Film", Physical Review Letters, American Physical Society, New York, US, vol. 91, No. 15, Oct. 10, 2003, pp. 157406-1, XP002327890, ISSN: 0031-9007, DOI: DOI:10.1103/PHYSREVLETT.91.157406.

International Search Report and Written Opinion—PCT/US2010/055328—ISA/EPO—Dec. 15, 2011.

Schon J.H., et al.,"A Light Emitting Field-Effect Transistor", Science.

American Association for the Advancement of Science, Washington, DC; US, vol. 290, Nov. 3, 2000, pp. 963-965, XP002327889, ISSN: 0036-8075, DOI: DOI:10.1126/SCIENCE.290.5493.963.

(Continued)

*Primary Examiner* — Jermele M Hollington
(74) *Attorney, Agent, or Firm* — Michelle Gallardo

(57) ABSTRACT

A light-emitting circuit includes a light-emitting transistor and a voltage supply in communication with the light-emitting transistor to bias the light-emitting transistor in a reasonably bright state. A reasonably bright state is a state in which light emission approaches the greatest for a given drain-source current in the light-emitting transistor. In one aspect, the light-emitting circuit is in communication with a device under test and configured so that the light-emitting transistor emits photons in a manner indicative of an operation of the device under test. The light-emitting circuit may be disposed in a first semiconductor layer, and the device under test may be disposed in a second semiconductor layer. Further, the first semiconductor layer may be included in a first die, and the second semiconductor layer may be included in a second die.

23 Claims, 9 Drawing Sheets

OTHER PUBLICATIONS

Stefan Rusu et al. "Backside Infrared Probing for Static Voltage Drop and Dynamic Timing Measurements" ISSCC 2001 / Session 17 / TD: 3D Technologies and Measurement Techniques / 17.5, 2001 IEEE International Solid-State Circuits Conference 0-7803-6608-5.

M. Gurfinkel et al. "Study of Hot-Carrier-Induced Photon Emission from 90nm Si MOSFETs" School of Electrical Engineering, Tel-Aviv University, Ramat-Aviv 69978, Israel, Freescale Semiconductor Israel Ltd., Herzlia 46725, Israel, Applied Surface Science 248 (2005) 62-65.

F. Stellari et al. "Tools for Non-Invasive Optical Characterization of CMOS Circuits" Dipartimento di Elettronica e Informazione, Politecnico di Milano, Piazza L. da Vinci 32, 20133 Milano—Italy, STMicroelectronics—Central R&D, Via C. Olivetti 2,20041 Agrate Brianza, Milano—Italy, 0-7803-5410-9/99/1999 IEEE.

TECHNIQUES EMPLOYING LIGHT-EMITTING CIRCUITS

CROSS-REFERENCE TO RELATED APPLICATION

The present application claims the benefit of U.S. Provisional Patent Application No. 61/257,761, filed Nov. 3, 2009, and entitled "TECHNIQUES EMPLOYING BEACON CIRCUITS," the disclosure of which is incorporated by reference herein in its entirety.

TECHNICAL FIELD

The present description is related, in general, to light-emitting circuits and, more specifically, to circuits and techniques for providing improved bias to light-emitting devices.

BACKGROUND

The deployment of through-silicon stacking (TSS) products may affect which failure analysis methods are considered more desirable in some instances. In an example TSS product, a memory die is stacked directly on top of a logic die and connected electrically by vias that pass through the logic die directly to the memory die. For some types of failure analysis it is desirable to measure the voltage level on one or more of these vias, either to obtain an accurate analog measurement of voltage drop, or to measure timing of signals in the vias.

Some conventional systems employ light-emitting circuits to perform failure analysis. However, such conventional systems do not contemplate the case in which two dies (e.g., memory and logic) are tightly coupled in a TSS configuration. The tightly-packed arrangement of the dies in a TSS structure can make it difficult or impossible to observe the light from a light-emitting circuit. In general, the problem of probing TSS structures for failure analysis has not been directly addressed in the context of light-emitting circuits because TSS is a new method of assembling and packaging devices.

BRIEF SUMMARY

In one aspect, a light-emitting circuit is disclosed. The light-emitting circuit includes a light-emitting transistor and a voltage supply in communication with the light-emitting transistor to bias the light-emitting transistor in a bright state.

In another aspect, a debug and failure analysis circuit is disclosed. The debug and failure analysis circuit includes means for emitting light in proportion to an input signal and a voltage source in communication with the light-emitting means biasing the light-emitting means in saturation.

In yet another aspect, a method employing a light-emitting device is disclosed. The light-emitting device receives an input signal and emits light in relation to the level of the input signal. The method includes biasing the light-emitting device in a bright state, applying the input signal to the light-emitting device and observing an output of the light-emitting device.

In another aspect, a method is disclosed. The method employs a light-emitting device that receives an input signal and emits light in relation to the level of the input signal. The method includes the steps of: biasing the light-emitting device in a brightest state, applying the input signal to the light-emitting device, and observing an output of the light-emitting device.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 1 is not drawn to scale.

DETAILED DESCRIPTION

Figure 1:
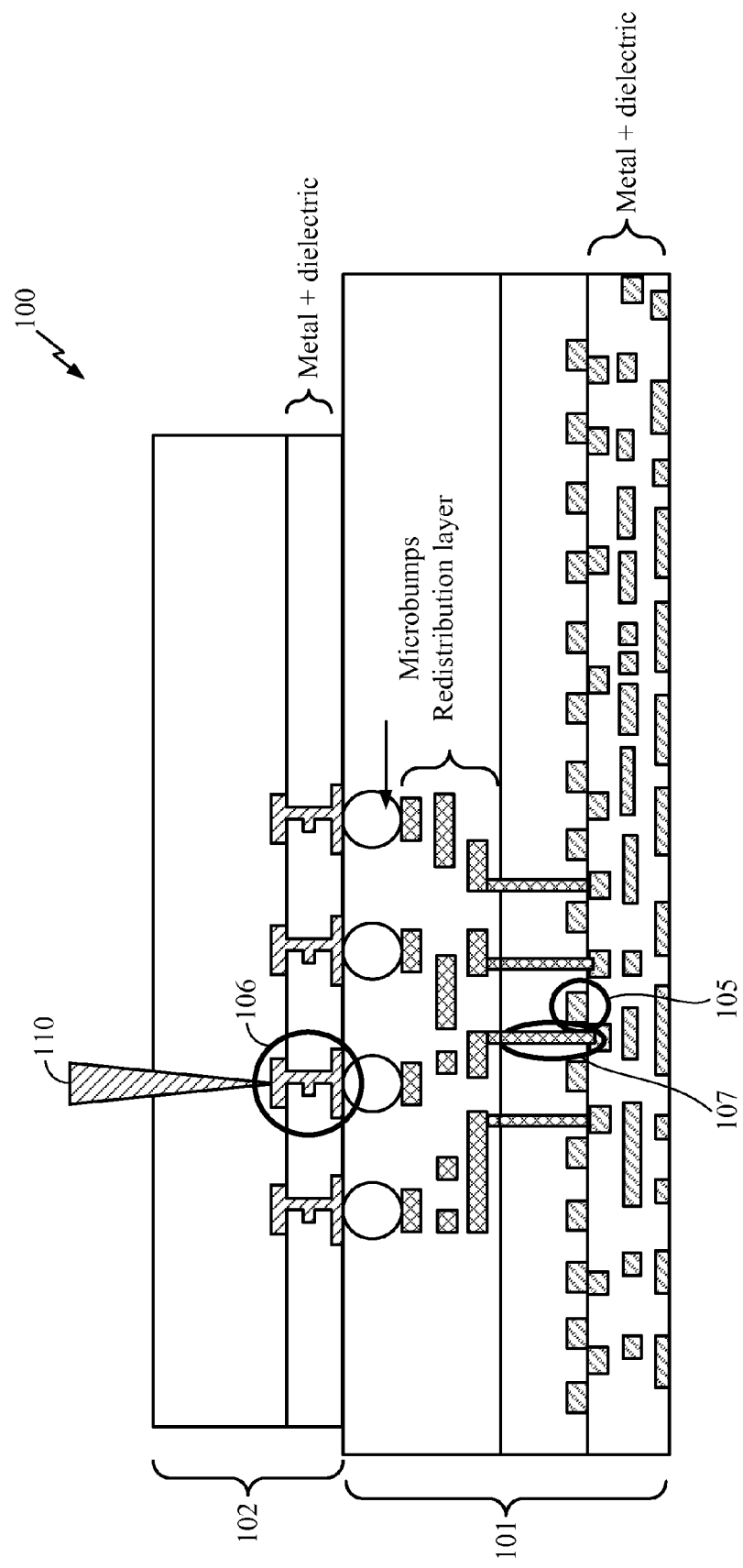
FIG. 1 is an illustration of an exemplary stacked die configuration according to one embodiment.

FIG. 1 is an illustration of an exemplary stacked die configuration 100 according to one embodiment. Failure analysis and circuit debugging can be performed on the stacked die configuration 100 using the probe cell structures discussed in more detail below. The stacked die configuration 100 includes the logic die 101 and the memory die 102, and the dies 101, 102 are in communication using Through Vias (e.g., the thought silicon via 107). Although the term "Through Silicon Via" is used, the substrate material is not limited to silicon, but can be any substrate material, such as sapphire, glass or another semiconductor material. Furthermore, the scope of embodiments is not limited to stacked die configurations, as various debug and failure analysis circuits can be deployed to any of a variety of different circuits. The scope of embodiments is not limited to the die stack, as shown. Rather more tiers could be present, or multiple die could be on each tier.

The logic die 101 includes the transistor under test 105, which is in communication with the probe cell 106 through the through via 107. The probe cell 106 includes at least one light-emitting circuit according to the examples described in more detail below. Specifically, FIGS. 2-9 give examples of light-emitting circuits that can be used in various embodiments to test a signal or circuit component.

A particular feature shown in FIG. 1 includes the use of the Focused Ion Beam (FIB) 110 to expose the structure of the probe circuit 106 and to deposit a metal pad (not shown) in communication with the signal from the transistor under test 105. The metal pad facilitates electrical techniques to mechanically probe the transistor under test 105. Thus, in addition to providing a way to optically probe the transistor under test 105, the structure of FIG. 1 provides a way to electrically observe and/or stimulate the transistor under test 105 during debug or failure analysis.

Figure 2:
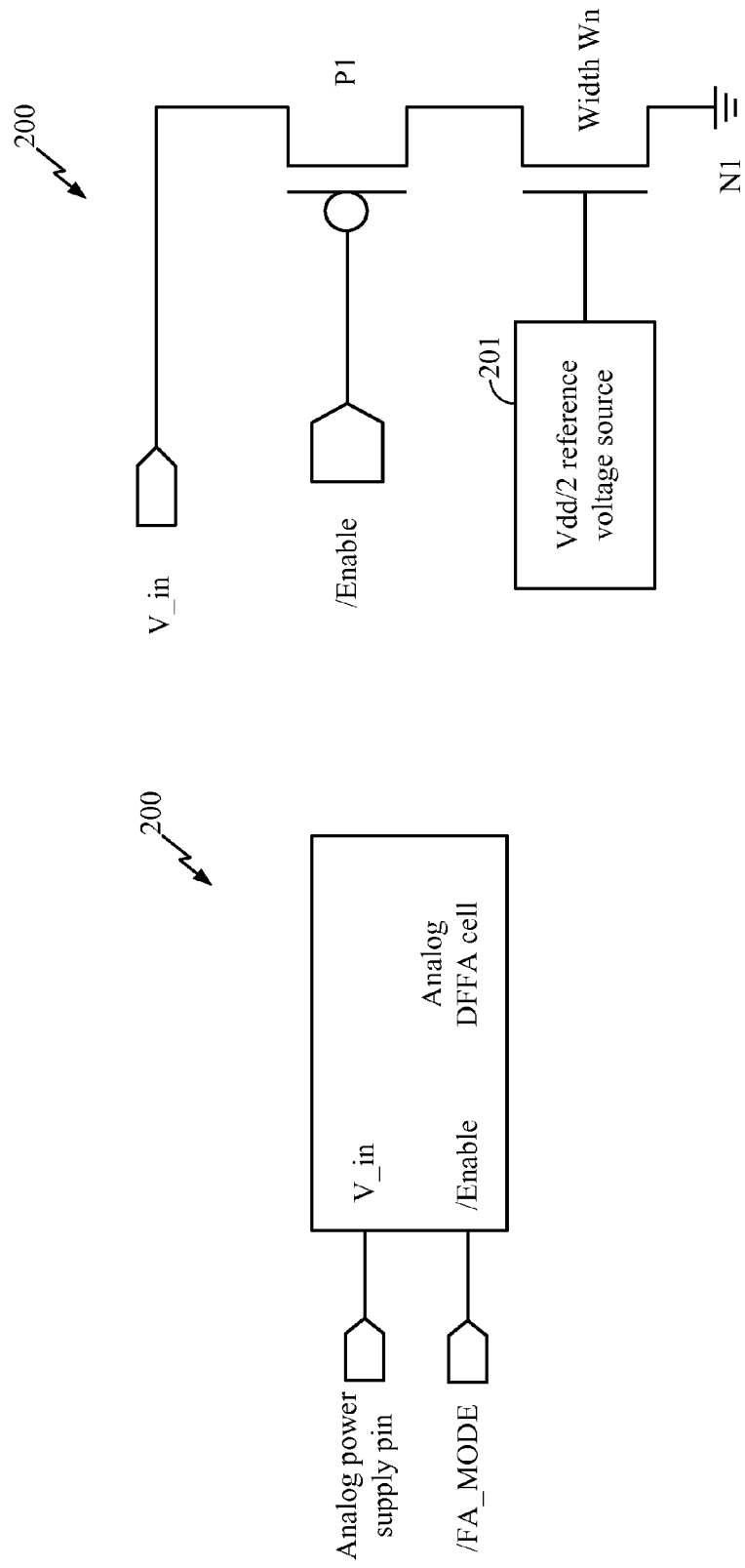
FIG. 2 is an illustration of an exemplary analog debug and failure analysis cell, shown on the left as a black box and on the right with further detail.

FIG. 2 is an illustration of an exemplary analog debug and failure analysis cell 200, shown on the left as a black box and on the right with further detail. The analog debug and failure analysis cell 200 provides an indication of the voltage in the example power signal V_in. The signal/failure analysis_mode is an enable signal that can turn the debug and failure analysis cell 200 on or off by opening the circuit at the transistor P1 when the /Enable signal is high. The transistor P1 is a PMOS transistor, and the transistor N1 is an NMOS transistor. Throughout this disclosure, transistors labeled N are NMOS transistors, and transistors labeled P are PMOS transistors.

As V_in increases, the brightness of N1 will correspondingly increase. Put another way, as V_in scales up and down by some variation, the amount of emission (e.g., infrared and visible radiation) created by the transistor N1 is related to the drain/source voltage (Vds) across the transistor N1. The voltage source 201 biases N1 in a reasonably bright state for a given V_in by holding the gate at Vdd/2, which corresponds to the saturation region of operation. The voltage source 201 is shown as a black box in FIG. 2, and an exemplary voltage source that may be employed as the voltage source 201 in some embodiments is described below with respect to FIG. 6. Equation 1 gives an illustration of how light emission changes with V_in, where $L_0$ and $V_0$ are process dependent constants, and Wn is a width of the transistor N1.

$$\text{Light emission } L = L_0 W_n \exp(-V_0/V_{in}) \quad (1)$$

Figure 3:
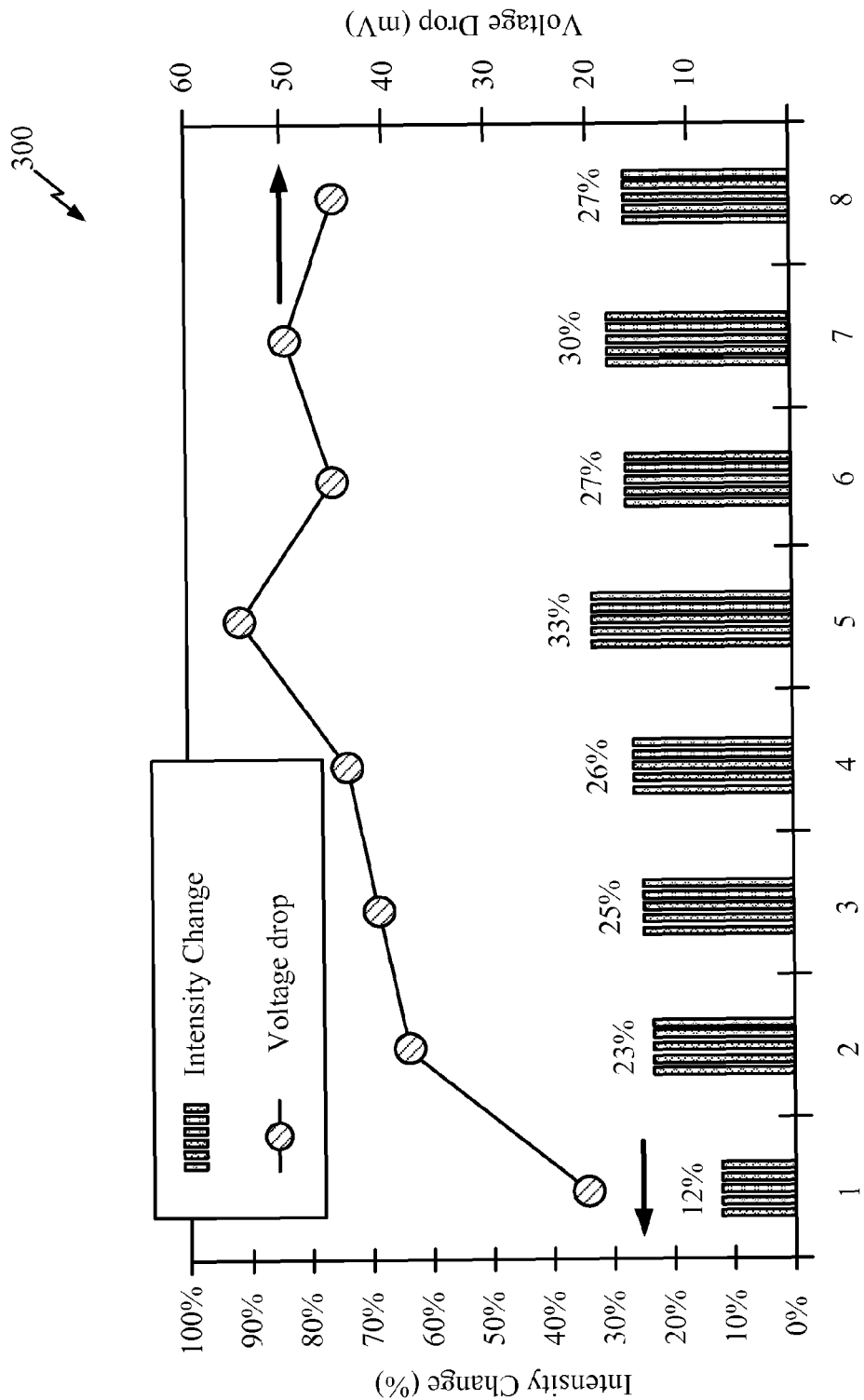
FIG. 3 is an illustration of the exemplary analog debug and failure analysis cell with a graph.

FIG. 3 is an illustration of the exemplary analog debug and failure analysis cell 200 with a graph 300. The graph 300 does not apply directly to the analog debug and failure analysis cell 200, but is meant to show that at least one conventional NMOS device achieved good brightness with a width, $W_n$, of 0.38 microns. For many embodiments of the disclosure, a $W_n$ of 0.38 microns will also provide good results, though the embodiments are not limited to any particular sized transistor. A general relationship is that for the same current density, the wider a transistor, the higher the likelihood of a hot electron event, or hot channel electron event, that creates photons. In the particular example shown in FIG. 3, V_in is in the range of 1 V, and voltage fluctuations as small as 10 mV can be detected.

Figure 4:
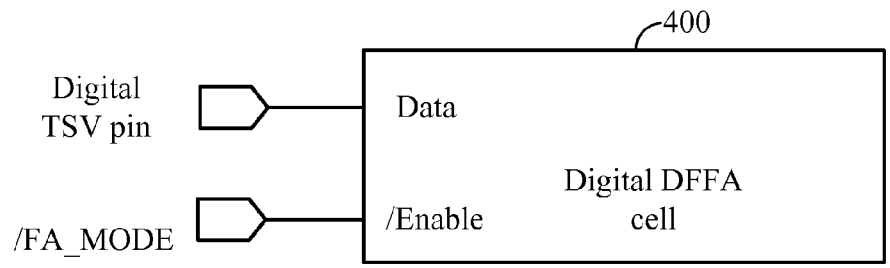
FIG. 4 is an illustration of an exemplary digital debug and failure analysis cell, adapted according to one embodiment.

FIG. 4 is an illustration of an exemplary digital debug and failure analysis cell 400, adapted according to one embodiment. The digital debug and failure analysis cell 400 can be used to test a digital signal and, for example, some or all pins of a die can be in communication with a respective digital debug and failure analysis circuit. Such arrangement can be applied to stacked dies where pins from one die are in communication with pins of another die. The digital debug and failure analysis cell 400 indicates the state of a given binary signal, as described in more detail with respect to FIG. 5. In addition to providing an indication of a signal state, digital debug and failure analysis circuits can also be used as sacrificial markers allowing access to circuit locations during deprocessing because the locations of digital debug and failure analysis circuits are known. /FA_MODE is an enable signal (or, more accurately, the inverse of an enable signal) that can turn the digital debug and failure analysis cell 400 on or off.

Figure 5:
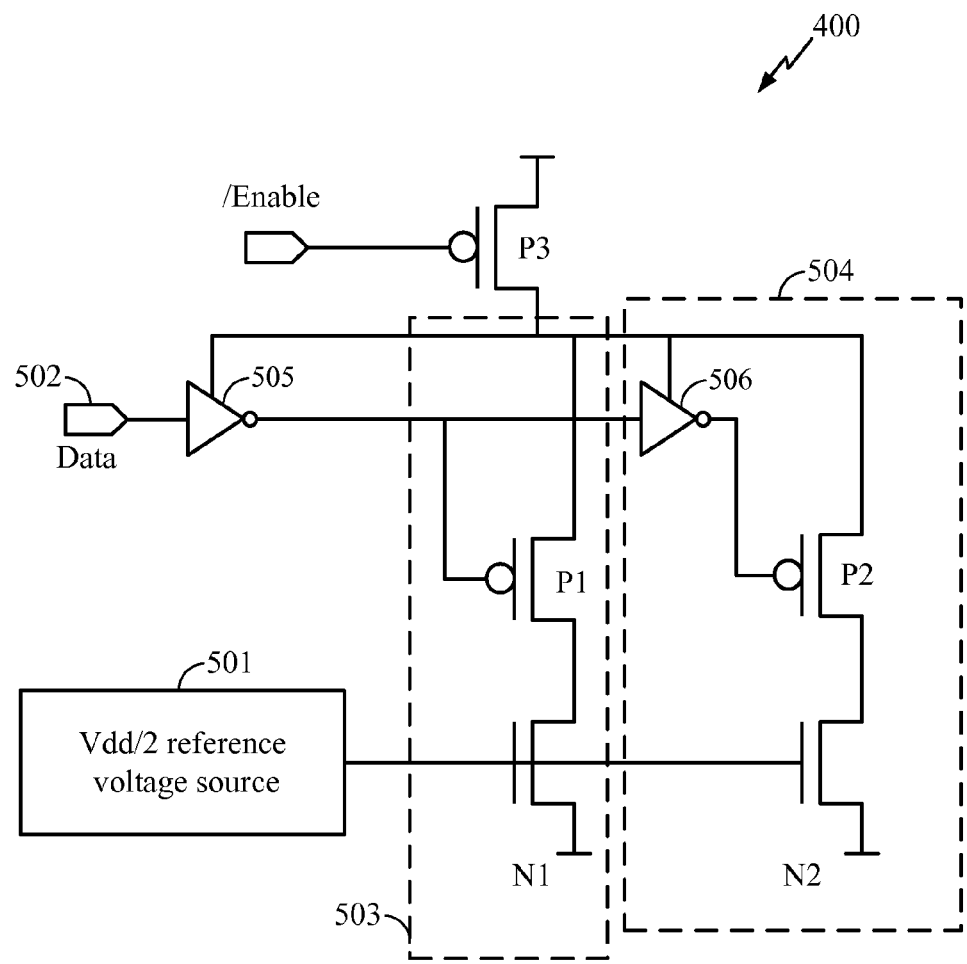
FIG. 5 is an illustration of the digital debug and failure analysis cell of FIG. 4 in more detail.

FIG. 5 is an illustration of the digital debug and failure analysis circuit 400 in more detail. Data is a binary data signal on the data port 502. N1 and N2 are complementary so that when Data is high, N1 emits while N2 does not emit, and when Data is low, N2 emits while N1 does not emit. N1 and N2 are biased to Vdd/2, which corresponds to a reasonably bright state of N1 and N2 for a given Vds. Equation 2 gives light emission according to Vds, which is the source/drain voltage of N1 or N2 wherein $L_0$ and $V_0$ are process-dependent constants, and wherein $W_n$ is an NMOS transistor gate width.

$$\text{Light emission} = L_0 W_n \exp(-V_0/V_{ds}) \quad (2)$$

An example application for the circuit of FIG. 5 indicates operation of the device under test. For example, a static state of a device under test could be examined. Another example application is discerning timing information of a circuit under test. For applications that discern timing information, the complementary nature of the circuit of FIG. 5 provides a helpful feature in that it gives an indication of Data and Data complement (also referred to as "Data bar" and "/Data"). Thus, the circuit of FIG. 5 provides a positive indication of the specific state of the Data signal at a given time.

In an example of use of the circuit of FIG. 5, the circuit is put into a debug state. When /Enable is low, the P3 transistor is turned on, which activates the whole circuit. When /Enable is high, the whole circuit is turned off, thereby conserving energy. In various embodiments, the enable signal is used to turn the circuit 501 on and off, such that the circuit 501 is on during the debug state and, otherwise, is off.

Assuming debug state is on, the circuit 501 applies a voltage of Vdd/2 to the gates of the transistors N1 and N2, to put the transistors N1 and N2 into the saturation region. Thus, the transistors N1 and N2 are biased to a reasonably bright state for a given Vds. As the Data signal is propagated at the data port 502, the Data signal is affected by the first inverter 505 and by the second inverter 506. When Data is high (i.e., a logical 1) coming in, it is low at the gate of P1, thereby turning P1 on. When Data is high, current flows across N1, and there is a voltage across N1, allowing the N1 transistor to emit light.

Complementarily, the signal at the gate of the transistor P2 is high. When the gate voltage is high in this case, the channel of the transistor P2 is shut off so that there is no current conducting on N2. As a result, there is no photonic emission from the transistor N2.

In an example wherein the Data signal is low, the gate of the transistor P2 is at a low voltage so that the transistor P2 is turned on. At the transistor P1, the input to the gate is high so that the transistor P1 is turned off, and no current is flowing through N1. Therefore, N1 does not emit light. In this manner, if Data is high, N1 emits. If Data is low, N2 emits.

In the particular example of FIG. 5, $W_n$ is greater than two microns for reasons of optical resolution. Specifically, due to lenses that are used in instruments that receive and detect emissions (not shown), the light source wavelength will have trouble resolving features that are less than two microns. The Raleigh criteria for resolution states, essentially, that the resolution is equal to the wavelength of light used to image divided by the numerical aperture of the instrument divided by two. Infrared wavelengths are about one micron, and the numerical aperture of the system, which can be different in other embodiments, is around one micron or less than one micron, so that the ultimate resolution of the infrared imaging of the system is about one-half micron. One-half micron is at the theoretical limit of what can be seen for some systems. Thus, a $W_n$ greater than two microns is chosen to ensure that emissions from N1 can be detected and processed, although this is not the technical limit of what can be imaged. Due to engineering margins and differently sized instruments, other embodiments may employ transistors with a $W_n$ less than two microns.

Furthermore, relative sizing of the PMOS and NMOS transistors can be selected so that the amount of current that a NMOS transistor can source while it is saturated is about what a larger PMOS transistor can sink when it is biased in its linear region. In another example, the circuit block 504 can be omitted from some embodiments, depending on the application, because the circuit block 503 alone can indicate a state of the signal with some amount of dependability (though other embodiments may benefit from having the circuit block 504 as well).

Figure 6:
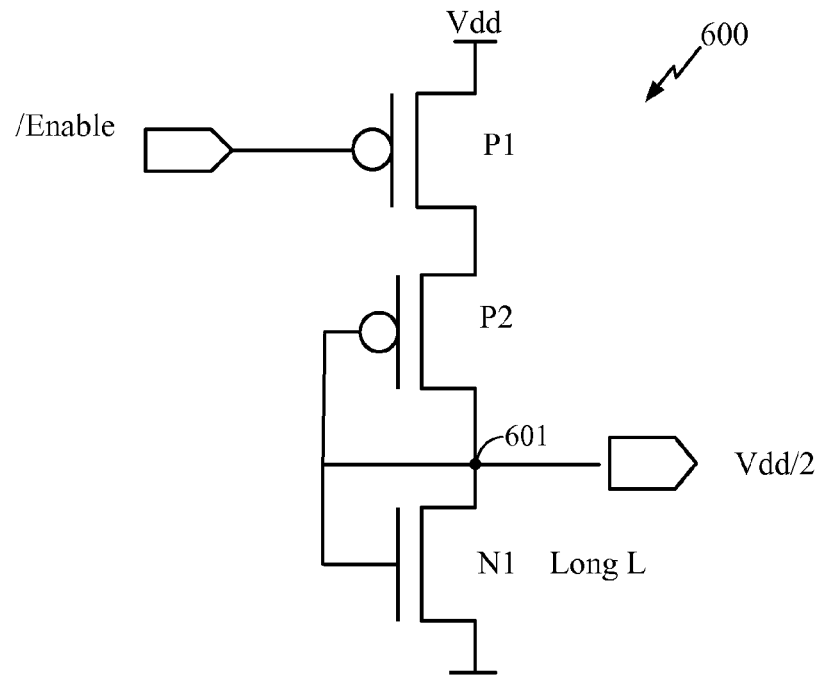
FIG. 6 is an illustration of an exemplary voltage supply adapted according to one embodiment.

FIG. 6 is an illustration of an exemplary voltage supply 600 adapted according to one embodiment. The voltage supply 600 can be used in previously-discussed embodiments to bias an emitting NMOS transistor, and the output of the voltage supply 600 is Vdd/2. In the voltage supply 600, /Enable is an inverse enable signal that can turn the voltage supply 600 on or off by making or breaking the circuit at the P1 transistor. In the circuit 600, transistors P1 and N1 are configured as a resistor divider to create an equilibrium at Vdd/2. In some embodiments, a long transistor length for N1 is selected because a longer N1 is usually more immune to process variation.

The circuit 600 can create a fairly stable Vdd/2 signal. The transistor P1 is used as a head switch, such that the /Enable signal turns P1 on and off. When P1 is off, the circuit 600 is off. Once the circuit 600 is turned on, the output voltage (Vdd/2) is self-regulating, where the output of transistors N1 and P1 regulate the input gate bias on both input gates at point 601. If the output voltage level of the transistor P2 increases, the corresponding voltage increase on the gate of the transistor P2 will reduce the current flow through the transistor P2, and voltage on the gate of N1 will result in a reduced resistance path to ground, thus the node is self regulating at point 601.

Figure 7:
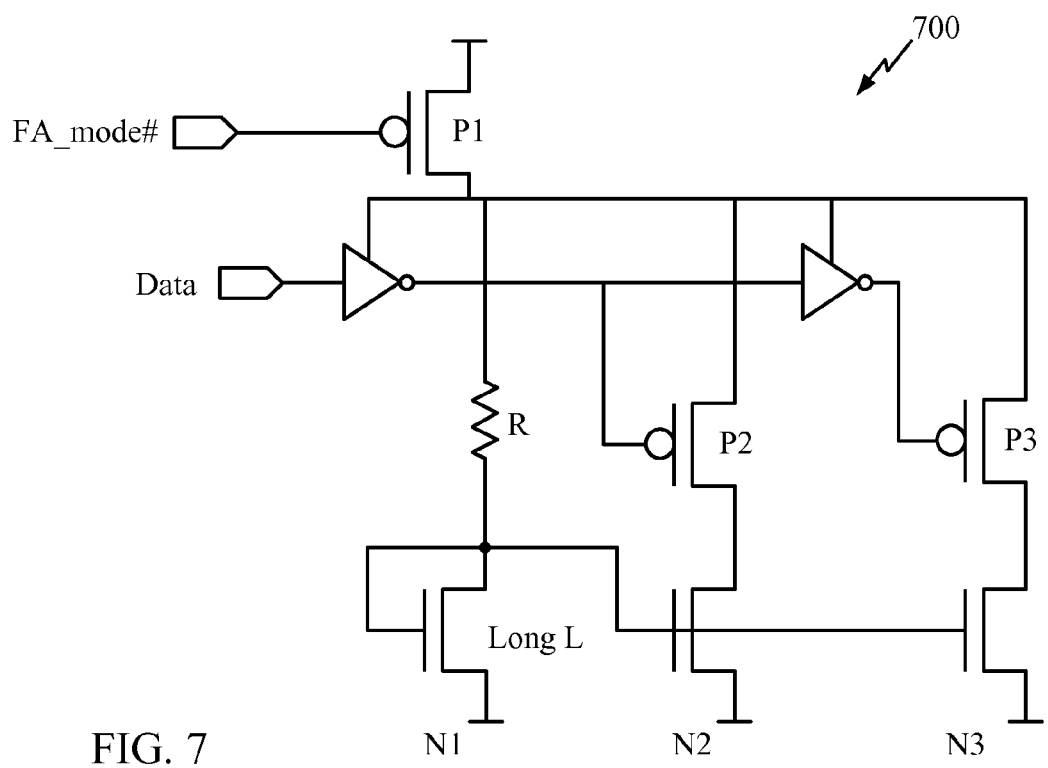
FIG. 7 shows an exemplary digital debug and failure analysis circuit adapted according to one embodiment.

FIG. 7 shows an exemplary digital debug and failure analysis circuit 700 adapted according to one embodiment. The digital debug and failure analysis circuit 700 provides complementary indications regarding the state of the Data signal, as described above with respect to FIG. 5. In FIG. 7, FA_mode# is an enable signal, and Data is a binary data signal. N2 and N3 are emitting transistors, and N1 is a transistor in a voltage supply circuit conforming to the configuration of the voltage supply circuit 600 of FIG. 6. Thus, N1 biases N2 and N3 to reasonably bright states for a given voltage by biasing N2 and N3 to their saturation operating regions. In this example, a reasonably bright state for a given transistor N2 or N3 is when the gate of the given transistor is biased at Vdd/2. The light emission increases as Vds (drain/source voltage of N2 or N3) approaches Vdd. Equation 3 shows how light emissions vary with Vds wherein Id is a drain current value for N2 or N3, and $V_O$ is a process-dependent constant.

$$\text{Light} \sim Id \exp(-V_O/Vds) \qquad (3)$$

Figure 8:
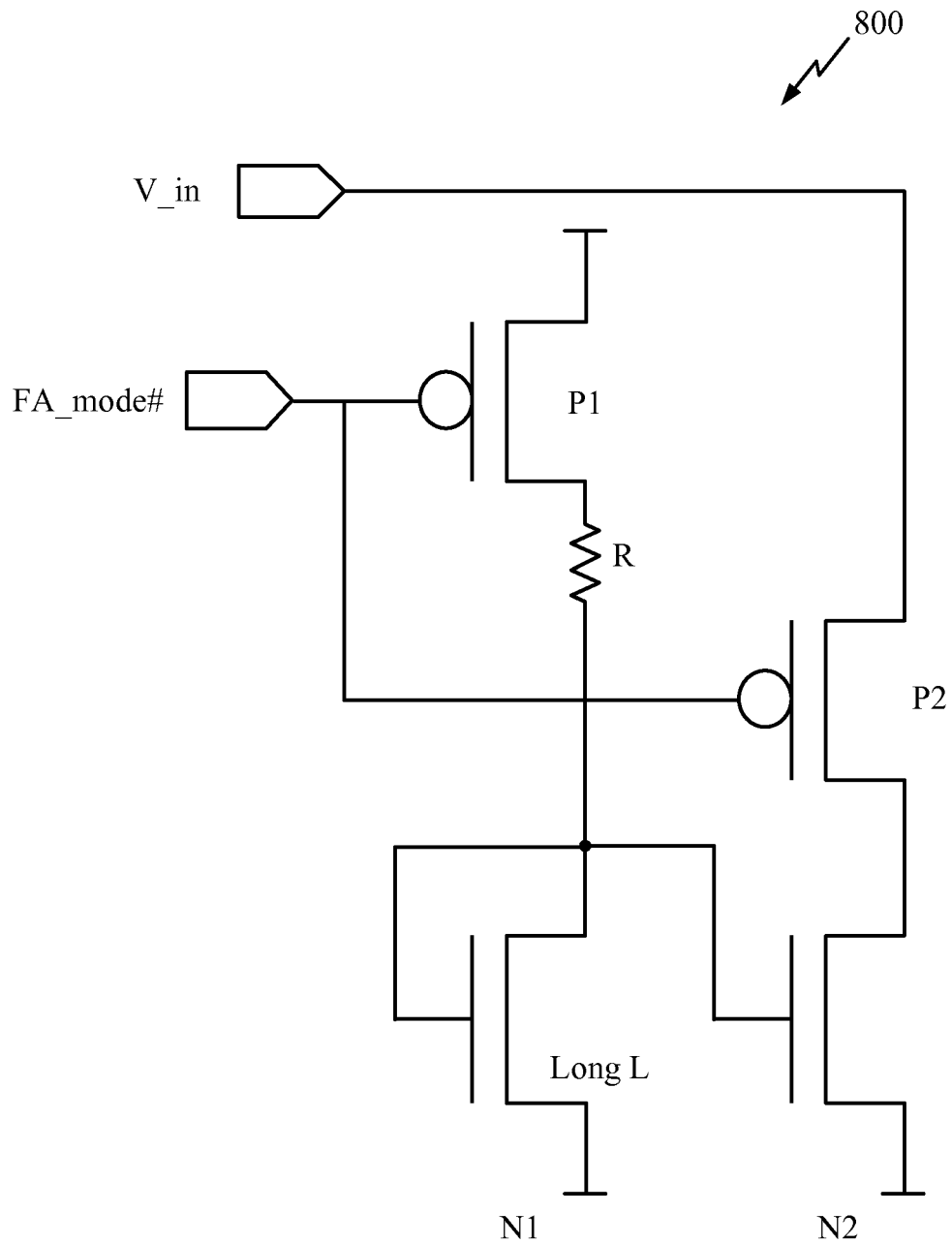
FIG. 8 shows an exemplary analog debug and failure analysis circuit adapted according to one embodiment.

FIG. 8 shows an exemplary analog debug and failure analysis circuit 800 adapted according to one embodiment. In this example, light emissions are proportional to V_in, as shown by Equation 4, so that as V_in increases, the light increases as well according to a known relationship, where $V_O$ is a process-dependent constant.

$$\text{Light} \sim \exp(-V_O/V\_in) \qquad (4)$$

In FIG. 8, FA_mode# is an enable signal. N2 is an emitting transistor, and N1 is a transistor in a voltage supply circuit conforming to the configuration of the voltage supply circuit 600 of FIG. 6. Thus, N1 biases N2 in a reasonably bright state for a given value of V_in. In this example, a reasonably bright state is when the gate of N2 is biased at Vdd/2. As Vds (drain/source voltage of N2) increases toward Vdd, emissions increase as well. An instrument, not shown, can receive the light, quantify its intensity, and relate the intensity to a voltage level. A particular use of the analog debug and failure analysis circuit 800 is to find a voltage drop in a power grid of a die. For instance, an array of analog debug and failure analysis circuits distributed throughout a die can be used to check for significant variations in the voltage of a die between the periphery and the center.

Figure 9:
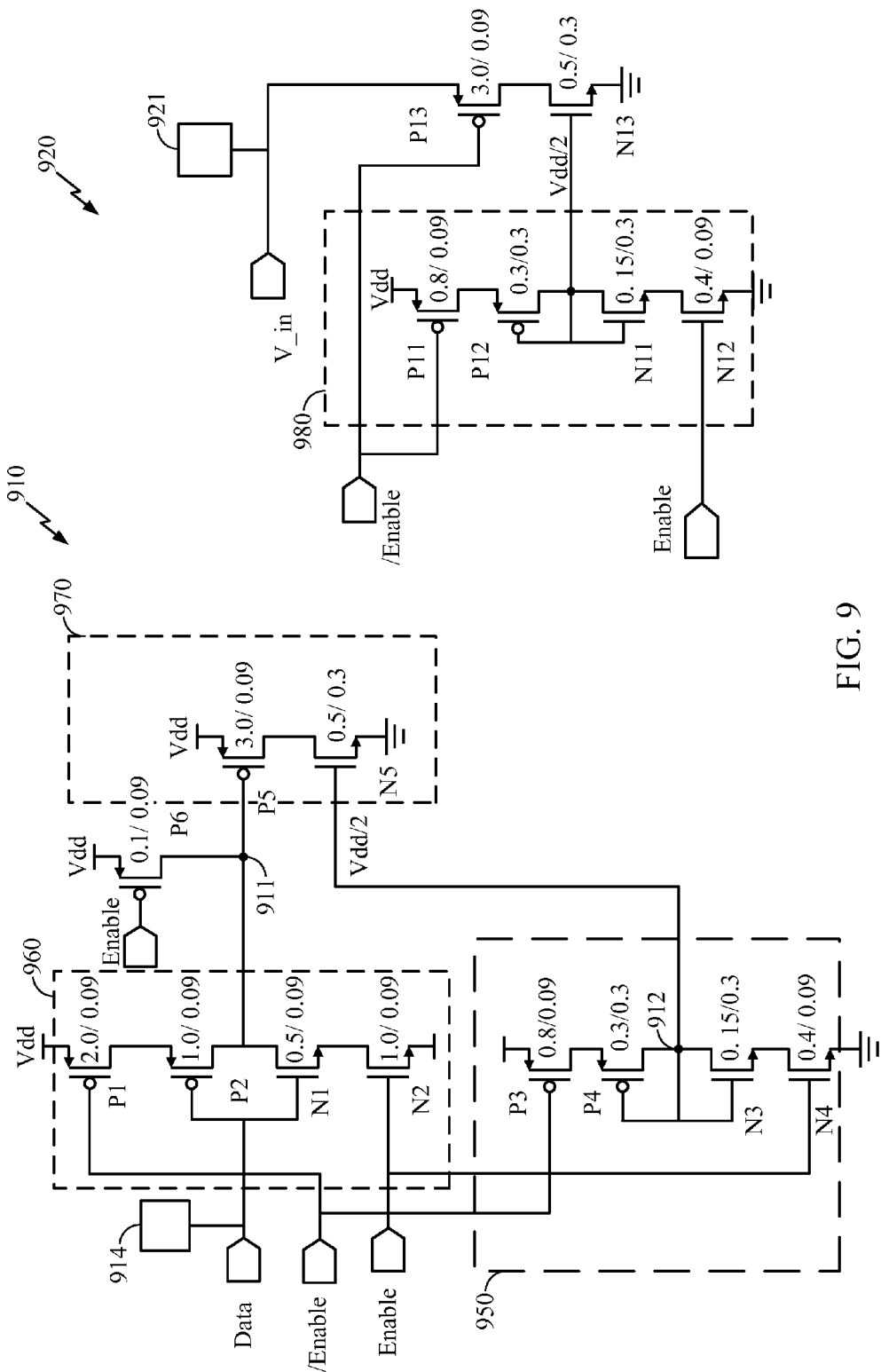
FIG. 9 is an illustration of the exemplary digital debug and failure analysis cell and analog debug and failure analysis cell adapted according to one embodiment.

FIG. 9 is an illustration of the exemplary digital debug and failure analysis circuit 910 and analog debug and failure analysis circuit 920 adapted according to one embodiment. In the digital debug and failure analysis cell 910, N5 is an emitting transistor, and its gate is biased at a voltage sufficient to put N5 into saturation. Similarly, in the analog debug and failure analysis circuit 920, N13 is an emitting transistor, and its gate is biased at a voltage sufficient to put N13 into saturation. Both the digital debug and failure analysis circuit 910 and the analog debug and failure analysis circuit 920 have test enable capabilities. When the circuits are disabled, they are shut off and not drawing any current.

The circuit 910 is a digital circuit that receives the digital signal Data and provides emissions at the transistor N5 indicative of the state of the Data signal. The transistors P3, P4, N3, N4 are configured as a biasing circuit 950 that provides a stable biasing voltage Vdd/2 to the base of the emitting transistor N5 when the biasing circuit is enabled. The circuit that includes the transistors P1, P2, N1, and N2 is a data circuit 960. The transistors P2 and N1 form an inverter that creates the complement of the Data signal. The data circuit 960, when enabled, passes the complement of the Data signal to the emitting transistor N5 via the gate of the P5 transistor. The circuit that includes the transistors P5 and N5 is an emitting circuit 970 that causes the emitting transistor N5 to emit and not emit consistent with the state of the Data signal.

The circuit 960 can be enabled and disabled using the transistors P1 and N2 as a head switch and a foot switch, respectively. The circuit 960 uses an Enable signal and a complementary Enable signal (shown as /Enable) so that the circuit 960 is switched on and off at both the power source and the ground. Specifically, within the data circuit 960, the Enable and /Enable signals can make and break the circuit at the transistor P1 (at Vdd) and at the transistor N2 (at ground).

Similarly, the biasing circuit 950 can be turned on and off at the transistors P3 and N4 using the Enable and /Enable signals. The enable/disable configurations described above with respect to the circuits 950 and 960 that make and break circuits at a power and at a ground may provide some improvements over embodiments that make and break a circuit at only one point. Specifically, such configurations may help to improve stability of the circuit and decrease leakage.

The circuit 910 has an additional enabling/disabling mechanism that includes the transistor P6. When the Enable signal is low, the node 911 goes to a high voltage, which turns the transistor P5 off. When the Enable signal is high, the transistor P6 is off, and the node 911 is at the voltage of the Data complement signal.

Referring now to the biasing circuit 950, the transistors N3 and P4 have their gates tied together with the node 912. Such configuration of N3 and P4 is a resistor divider, where the resistance at the top of the stack is substantially equivalent to the resistance at the bottom of the stack. The biasing circuit 950 provides a stable, self-biasing Vdd/2 voltage that is applied to the gate of the N5 transistor when the biasing circuit 950 is enabled. Similar to the examples above, the biasing voltage at the gate of the N5 transistor puts the N5 transistor in saturation, where N5 is in a reasonably bright state for a given drain/source voltage.

Assuming the circuit 910 is enabled, when a Data value of one is applied to the inverter (comprised of P2 and N1) the signal at the node 911 is a logical zero. The zero at the P5 gate turns the P5 transistor, thereby putting a bias across the N5 transistor. The conduction across N5 produces an emission pattern that can be observed.

Once again, assuming that the circuit 910 is enabled, when a Data value of zero is applied to the inverter (comprised of P2 and N1) the value at the node 911 is a logical one (in this example, Vdd). The one is applied to the gate of the P5 transistor, which turns the P5 transistor off. Therefore, no current flows through N5, and there is no emission. Additionally, as mentioned with respect to FIG. 1, the digital debug and failure analysis circuit 910 has a conductive pad 914 that can be integrated for FIB processes Turning to the analog debug and failure analysis circuit 920, the biasing circuit 980 operates in the same way as the biasing circuit 950. P11 and N12 act as switch circuits, allowing the power to be turned on and P12 and N11 to be enabled. P12 and N11 are configured as a resistor divider to create an equilibrium at Vdd/2. The Vdd/2 voltage is applied to the gate of the N13 transistor and puts the N13 transistor into saturation.

N13 is at a point that it is energized with Vdd/2, but it will not emit unless there is a signal on P13. The emission from N13 correlates to the V_in voltage supplied on the source of the P13 transistor. For a given V_in value greater than zero, the bias at the gate of N13 creates the most emissions for that value of V_in. Additionally, as mentioned with respect to FIG. 1, the digital debug and failure analysis circuit 920 has a conductive pad 921 that can be created using FIB processes.

FIG. 9 includes numbers for a specific implementation to provide ease of illustration. For instance, at P1, the numbers, 2.0/0.09 refer to length and channel width, respectively, in microns. Furthermore, the designs assume a Samsung ninety nanometer CMOS process. Nevertheless, it should be noted that various embodiments are not limited to the specific implementation of FIG. 9, as other embodiments may be adapted to different configurations and/or scaled using differently sized components. Moreover, while some examples above show a voltage of Vdd/2 used to bias an emitting transistor, it is noted that the scope of embodiments is not so limited. Any biasing voltage sufficient to place a transistor in a reasonably bright state for a given voltage across that transistor may be used in various embodiments.

Figure 10:
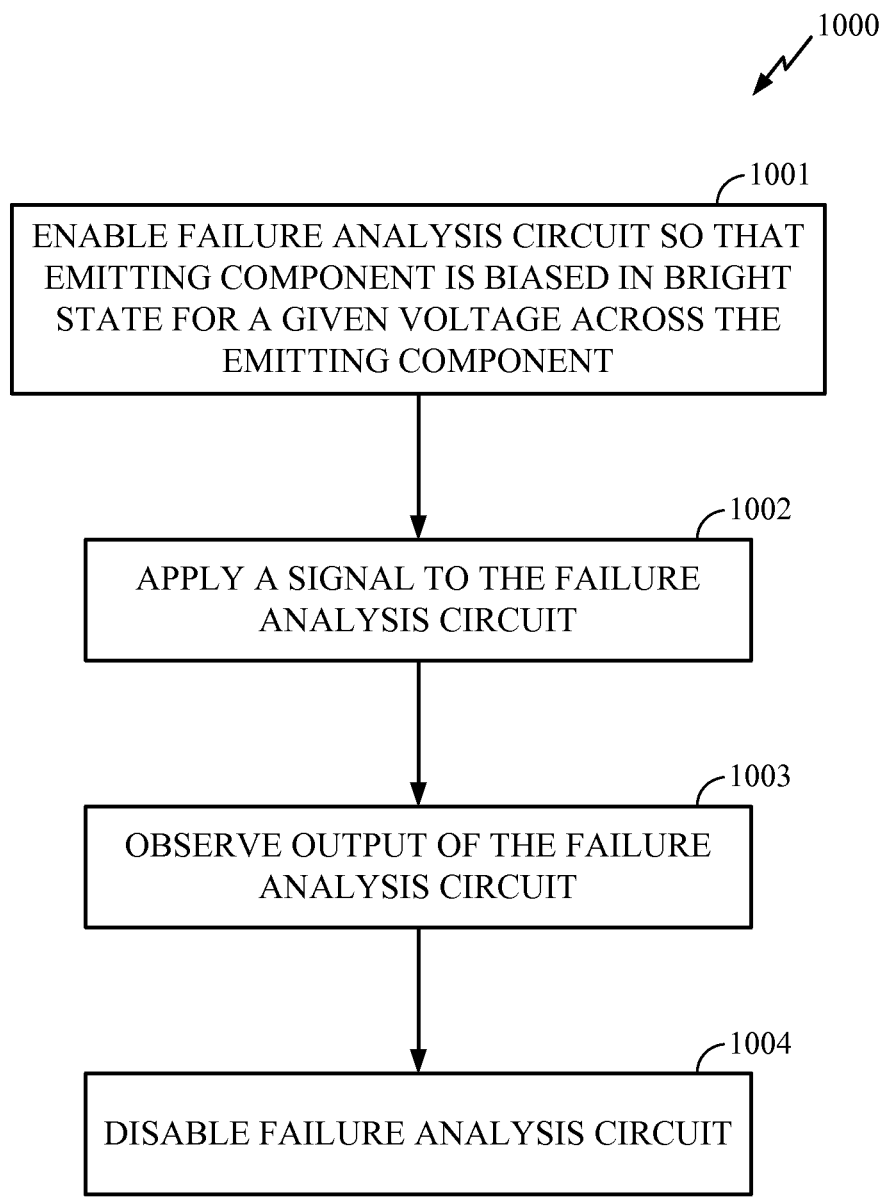
FIG. 10 is an illustration of the exemplary process adapted according to one embodiment.

Furthermore, while the embodiments above focus on the circuits themselves, other embodiments include methods for use with same or similar circuits. FIG. 10 is an illustration of the exemplary process 1000 adapted according to one embodiment. In various embodiments, the debug and failure analysis circuit is arranged as shown in FIG. 1 so that the debug and failure analysis circuit provides an indication of a circuit or signal under test.

In block 1001, the debug and failure analysis circuit is enabled, and its emitting component is biased so that the emitting component is in a reasonably bright state for a given voltage across the emitting component. Examples of debug and failure analysis circuits for use in the process 1000 include both digital and analog circuits, such as the debug and failure analysis circuits described above. Biasing the emitting component, in various embodiments, includes applying a voltage to the gate of the emitting component that places the emitting component in saturation.

In block 1002, a signal is applied to the debug and failure analysis circuit to indicate operation of the device under test. In some examples, the debug and failure analysis circuit includes an analog debug and failure analysis circuit, such as the circuit 920 of FIG. 9. In such an embodiment, a time-varying analog signal is applied to the circuit and causes current to flow across the emitting component. The brightness of the emitting component is directly related to the signal level of the analog signal.

In another example, the debug and failure analysis circuit includes a digital circuit, such as the circuit 910 of FIG. 9. A binary digital signal is applied to the debug and failure analysis circuit, and one or more emitting components are either on or off to indicate the state of the signal.

In block 1003, the output of the debug and failure analysis circuit is observed. In an embodiment where the emitting component is disposed on the outside of a die (or other structure), the light from the emitting component can be detected and analyzed non-invasively. In some embodiments, a photonic sensor assembly can be used to detect and record a shape of the signal to reconstruct a shape of the signal for signal level analysis, timing analysis, and/or the like. Any device now known or later developed for capturing the light from the emitting component and analyzing the light can be used in some embodiments.

Moreover, some embodiments include an electrical output, such as the pads 921 and 914 of FIG. 9, allowing the debug and failure analysis circuit to be observed electrically as well as optically. The output of the debug and failure analysis circuit can be analyzed for any of a variety of purposes, such as timing analysis, signal level analysis, checking the presence or absence of electrical connection, checking the operability of a circuit under test, and the like.

In the block 1004, the debug and failure analysis circuit is disabled. While FIG. 10 is shown as a series of discrete actions, the process 1000 can be modified so that actions may be added, omitted, rearranged, or changed. For instance, the actions of blocks 1002 and 1003 may be repeated during a testing procedure.

Various embodiments improve upon conventional debug and failure analysis techniques employing light-emitting circuits. For instance, various embodiments optimize biasing conditions to obtain the brightest possible emission strength for a given transistor size, and/or the brightest possible emission for a given amount of current available. The additional brightness can, in some instances, make observation of the light-emitting circuit more convenient and/or more reliable.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

Figure 11:
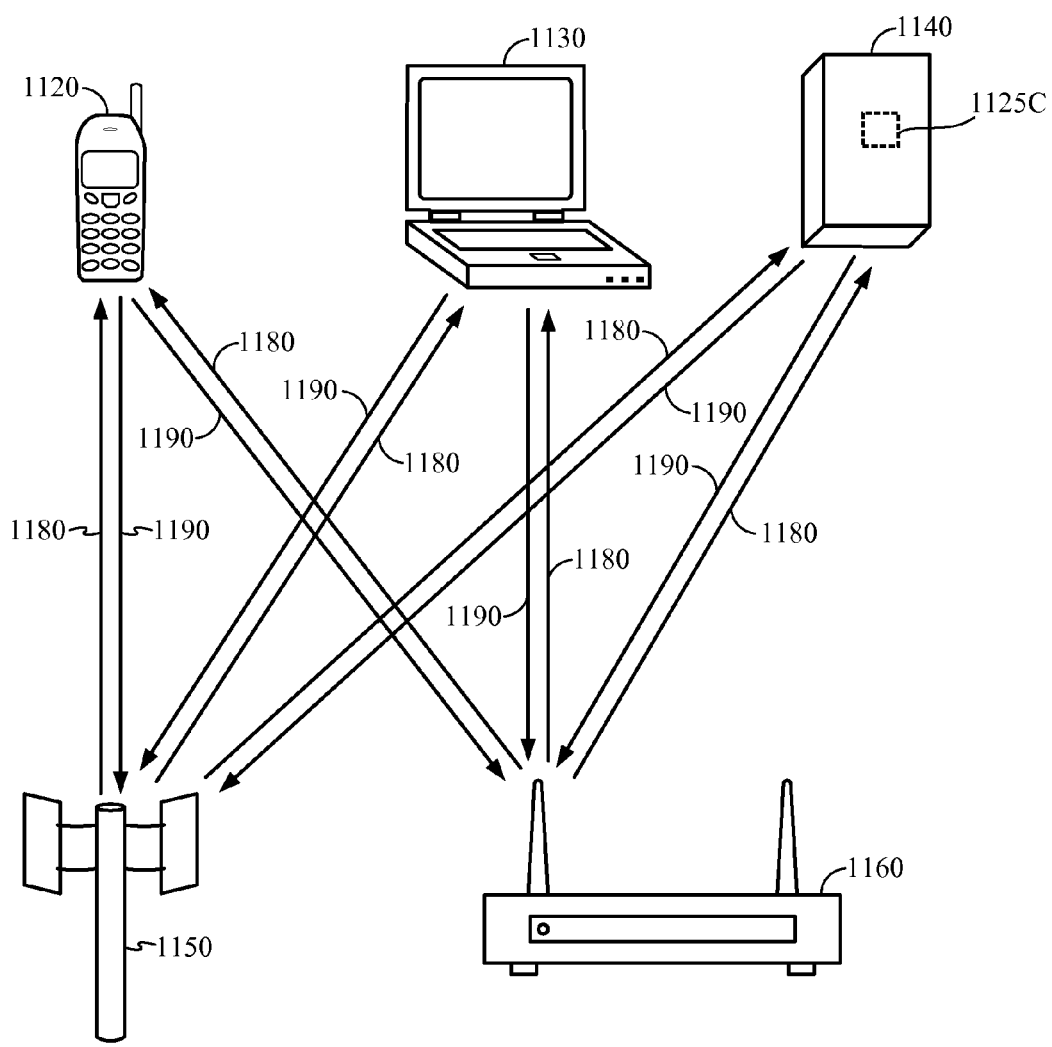
FIG. 11 shows an exemplary wireless communication system in which an embodiment of the disclosure may be advantageously employed.

FIG. 11 shows an exemplary wireless communication system 1100 in which an embodiment of the disclosure may be advantageously employed. For purposes of illustration, FIG. 11 shows three remote units 1120, 1130, and 1140 and two base stations 1150, 1160. It will be recognized that wireless communication systems may have many more remote units and base stations. The remote units 1120, 1130, and 1140 include improved semiconductor processor devices 1125A, 1125B, and 1125C, respectively, which in various embodiments include functionality for debugging and/or failure analysis, as discussed further above. The functionality described in more detail above can be implemented using executable code stored to a computer-readable medium integral to, or separate from, the processor devices 1125A, 1125B, and 1125C. While not shown herein, the base stations 1150, 1160 also include processor devices that may be the same as or similar to the processor devices 1125A, 1125B, and 1125C. FIG. 11 shows the forward link signals 1180 from the base stations 1150, 1160 and the remote units 1120, 1130, and 1140 and the reverse link signals 1190 from the remote units 1120, 1130, and 1140 to base stations 1150, 1160.

In FIG. 11, the remote unit 1120 is shown as a mobile telephone, the remote unit 1130 is shown as a portable computer, and the remote unit 1140 is shown as a computer in a wireless local loop system. For example, the remote units may include mobile devices, such as cell phones, hand-held personal communication systems (PCS) units, portable data units such as personal data assistants; the remote units may also include fixed location data units such as meter reading equipment. Although FIG. 11 illustrates remote units according to the teachings of the disclosure, the disclosure is not limited to these exemplary illustrated units. The disclosure may be suitably employed in any device which includes circuits under test.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A light-emitting circuit comprising:
   a light-emitting transistor; and
   a voltage supply in communication with the light-emitting transistor to bias the light-emitting transistor in a bright state, the light-emitting circuit coupling with a device under test and configured so that the light-emitting transistor emits photons in a manner indicative of an operation of the device under test.

2. The light-emitting circuit of claim 1 in which the bright state comprises a state where a gate of the light-emitting transistor is biased at about Vdd/2, and a drain of the light-emitting transistor is at about Vdd, where Vdd is a supply voltage.

3. The light-emitting circuit of claim 1 in which the bright state comprises of operation in the saturation region.

4. The light-emitting circuit of claim 1 in which the bright state comprises a state near which light emission is greatest for a given drain-source current in the light-emitting transistor.

5. The light-emitting circuit of claim 1 in which the brightness of the light-emitting transistor is directly related to an input voltage to the light-emitting circuit.

6. The light-emitting circuit of claim 1 in which the light-emitting transistor achieves one of a light-emitting state and a non-light-emitting state based upon a state of an input signal to the light-emitting circuit.

7. The light-emitting circuit of claim 6 further comprising another light-emitting transistor in communication with the voltage supply achieving one of the light-emitting state and the non-light-emitting state complementarily to the light-emitting transistor.

8. The light-emitting circuit of claim 1 incorporated into a device selected from a group consisting of a music player, a video player, an entertainment unit, a navigation device, a communications device, a personal digital assistant (PDA), a fixed location data unit, and a computer.

9. The light-emitting circuit of claim 1 integrated into a semiconductor die.

10. The light-emitting circuit of claim 1 in which the light-emitting transistor comprises an N-type Metal Oxide Semiconductor (NMOS) device.

11. The light-emitting circuit of claim 1 in which the first semiconductor layer is included in a first die, and the second semiconductor layer is included in a second die.

12. The light-emitting circuit of claim 11 in which the first die and the second die are stacked, and in which the light-emitting circuit and the device under test are in communication using at least one through via.

13. A debug and failure analysis circuit comprising:
means for emitting light in proportion to an input signal; and
a voltage source in communication with the light-emitting means biasing the light-emitting means in saturation, the debug and failure analysis circuit coupling with a device under test and configured so that the light emitting means emits photons in a manner indicative of an operation of the device under test.

14. The debug and failure analysis circuit of claim 13 incorporated into a device selected from a group consisting of a music player, a video player, an entertainment unit, a navigation device, a communications device, a personal digital assistant (PDA), a fixed location data unit, and a computer.

15. The debug and failure analysis circuit of claim 13 integrated into a semiconductor die.

16. A method employing a light-emitting device that receives an input signal and emits light in proportion to a level of the input signal, the light-emitting device coupling with a device under test and configured so that the light-emitting device emits photons in a manner indicative of an operation of the device under test, the method comprising:
biasing the light-emitting device in a bright state;
applying the input signal to the light-emitting device; and
observing an output of the light-emitting device.

17. The method of claim 16 further comprising:
performing at least one of the following actions on the observed output of the light-emitting device:
analyzing the observed output for timing;
analyzing the observed output for signal levels; and
analyzing the observed output for operability of a device under test, in which the input signal is received from the device under test.

18. The method of claim 16 in which the light-emitting device is incorporated into a device selected from a group consisting of a music player, a video player, an entertainment unit, a navigation device, a communications device, a personal digital assistant (PDA), a fixed location data unit, and a computer.

19. The method of claim 16 in which the light-emitting device is integrated into a semiconductor die.

20. A method employing a light-emitting device that receives an input signal and emits light relative to a level of the input signal, the light-emitting device coupling with a device under test and configured so that the tight-emitting device emits photons in a manner indicative of an operation of the device under test, the method comprising the steps of:
biasing the light-emitting device in a bright state;
applying the input signal to the light-emitting device; and
observing an output of the light-emitting device.

21. The method of claim 20 further comprising the step of:
performing at least one of the following steps on the observed output of the light-emitting device:
analyzing the observed output for timing;
analyzing the observed output for signal levels; and
analyzing the observed output for operability of a device under test, in which the input signal is received from the device under test.

22. The method of claim 20 in which the light-emitting device is incorporated into a device selected from a group consisting of a music player, a video player, an entertainment unit, a navigation device, a communications device, a personal digital assistant (PDA), a fixed location data unit, and a computer.

23. The method of claim 20 in which the light-emitting device is integrated into a semiconductor die.

* * * * *